(12) United States Patent
Banerjee et al.

(10) Patent No.: US 8,797,702 B2
(45) Date of Patent: Aug. 5, 2014

(54) FOCUSING DEVICE FOR LOW FREQUENCY OPERATION

(75) Inventors: Debasish Banerjee, Ann Arbor, MI (US); Hideo Iizuka, Nissin (JP); Jaewook Lee, Ann Arbor, MI (US); Ercan Mehmet Dede, Ann Arbor, MI (US)

(73) Assignee: Toyota Motor Engineering & Manufacturing North America, Inc., Erlanger, KY (US)

( * ) Notice: Subject to any disclaimer, the term of this patent is extended or adjusted under 35 U.S.C. 154(b) by 374 days.

(21) Appl. No.: 13/172,109

(22) Filed: Jun. 29, 2011

(65) Prior Publication Data
US 2013/0003245 A1   Jan. 3, 2013

(51) Int. Cl.
*H01F 1/00*   (2006.01)
(52) U.S. Cl.
USPC .......................................................... 361/143
(58) Field of Classification Search
CPC ........................................................ H01F 1/00
USPC ......................................................... 361/143
See application file for complete search history.

(56) References Cited

U.S. PATENT DOCUMENTS

| | | | | |
|---|---|---|---|---|
| 5,528,211 | A * | 6/1996 | Perreaut et al. | 335/296 |
| 7,429,740 | B2 * | 9/2008 | Salvesen et al. | 250/396 ML |
| 2004/0051611 | A1 * | 3/2004 | Dudding et al. | 335/284 |
| 2004/0236450 | A1 * | 11/2004 | Bryant et al. | 700/108 |
| 2009/0230333 | A1 * | 9/2009 | Eleftheriades | 250/505.1 |
| 2009/0303154 | A1 * | 12/2009 | Grbic et al. | 343/909 |
| 2010/0065352 | A1 * | 3/2010 | Ichikawa | 180/65.8 |
| 2010/0231433 | A1 | 9/2010 | Tishin et al. | |
| 2011/0068884 | A1 * | 3/2011 | Brooks | 335/100 |
| 2012/0206001 | A1 * | 8/2012 | Lee et al. | 310/112 |
| 2012/0206226 | A1 * | 8/2012 | Lee et al. | 335/229 |
| 2013/0038147 | A1 * | 2/2013 | Dede et al. | 310/46 |

OTHER PUBLICATIONS

Mote, R.G. et al., "Near-field focusing properties of zone plates in visible regime—New insight," Optics Express, 16(13): 9554-9564, 2008.
Grbic, A. and R. Merlin, "Near-Field Focusing Plates and Their Design," IEEE Transactions on Antennas and Propagation, 56(10): 3159-3165 (2008).
Grbic, A. et al., "Near-Field Plates: Subdiffraction Focusing with Patterned Surfaces," Science, 320: 511-513 (2008).
Li, J. et al., "The influence of propagating and evanescent waves on the focusing properties of zone plate structures," Optics Express, 17(21): 18462-18468, 2009.
Imani, M.F. and A. Grbic, "Near-Field Focusing With a Corrugated Surface," IEEE Antennas and Wireless Propagation Letters, 8: 421-424, 2009.

* cited by examiner

*Primary Examiner* — Rexford Barnie
*Assistant Examiner* — Angela Brooks
(74) *Attorney, Agent, or Firm* — Gifford, Krass, Srpinkle, Anderson & Citkowski, P.C.

(57) ABSTRACT

An example apparatus for obtaining a desired magnetic field distribution from an incident magnetic field, such as a kHz magnetic field, comprises a structure receiving the incident magnetic field and generating the desired magnetic field distribution at a predetermined distance from the transmitting side of the apparatus. The desired magnetic field distribution results from a spatial distribution of induced electrical current over the structure. Examples of the invention also include design methods and methods of using the apparatus.

21 Claims, 7 Drawing Sheets

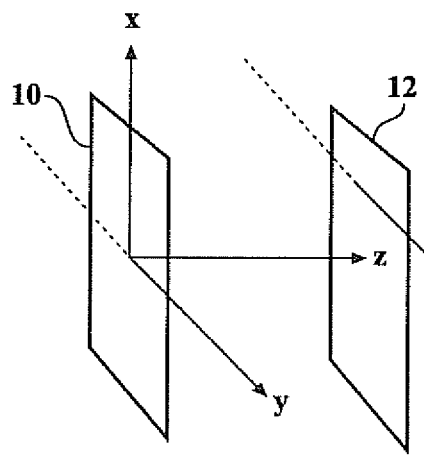
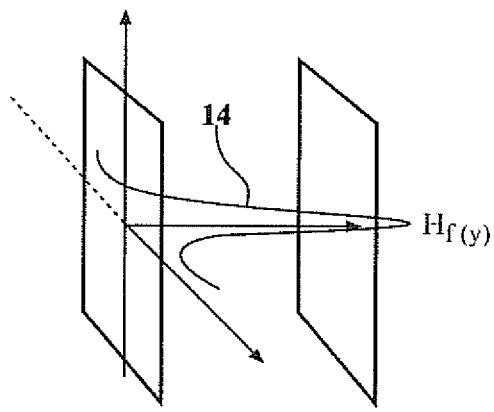
FIG. 1A  FIG. 1B
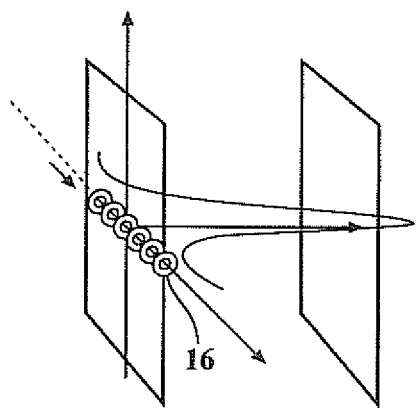
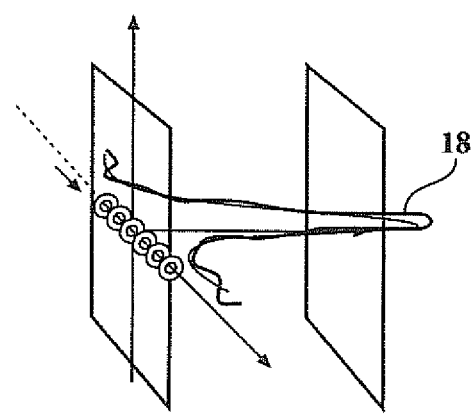
FIG. 1C  FIG. 1D
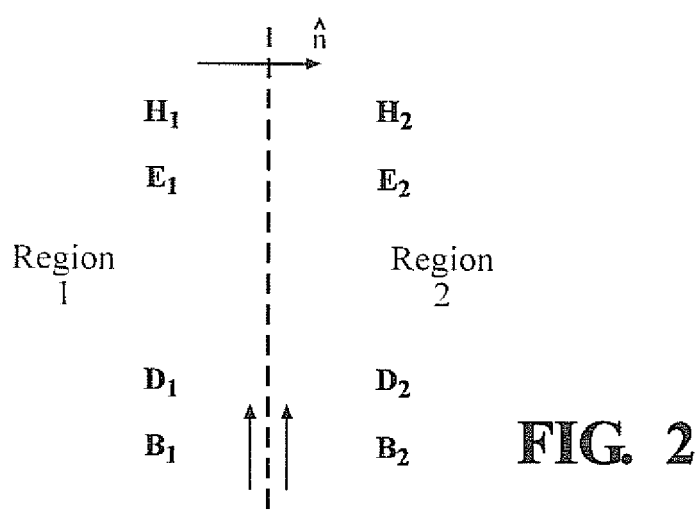
FIG. 2

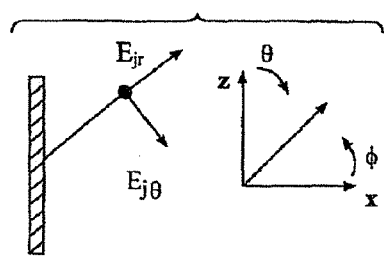
FIG. 3A
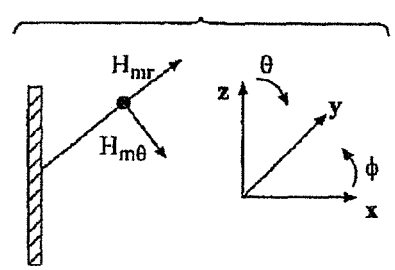
FIG. 3B
FIG. 4
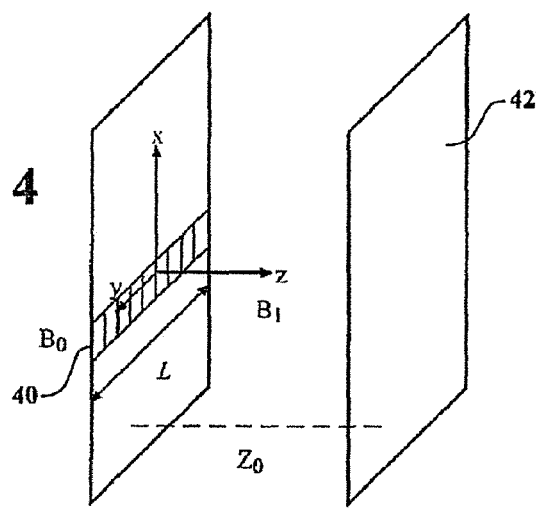
FIG. 5
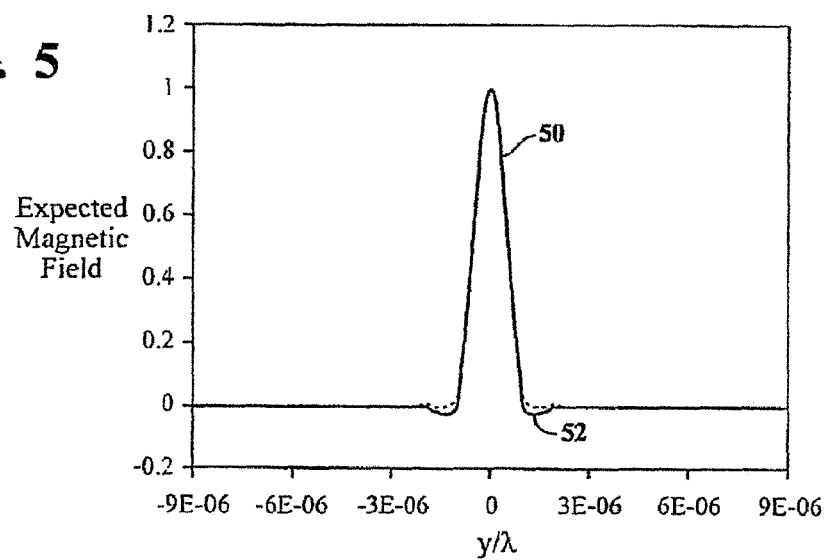

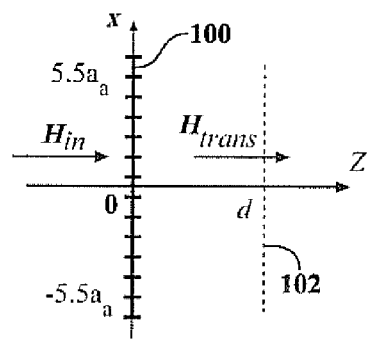
FIG. 10A
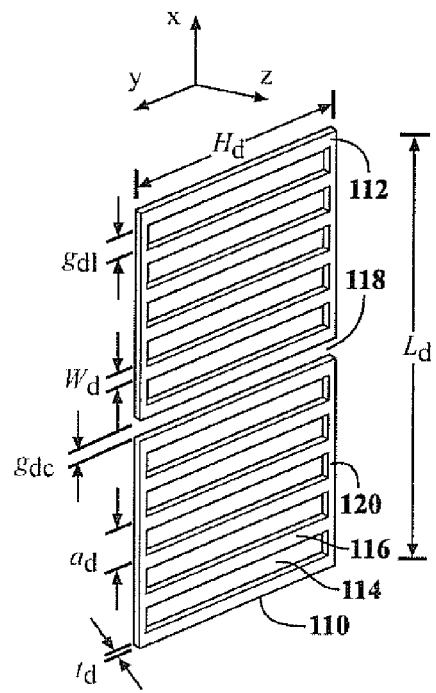
FIG. 10B
FIG. 11
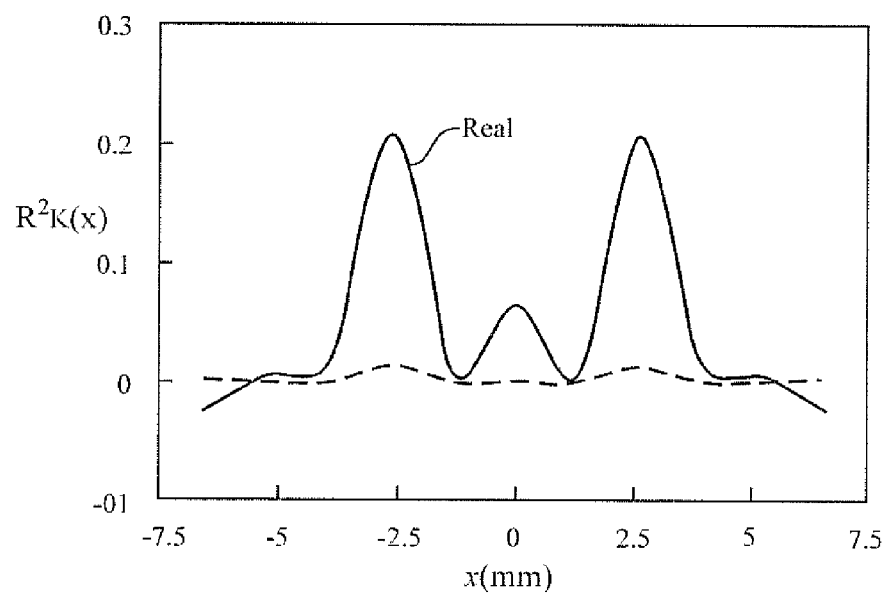

FOCUSING DEVICE FOR LOW FREQUENCY OPERATION

FIELD OF THE INVENTION

The invention relates to apparatus and methods for modifying magnetic field distributions, including the design and configuration of apparatus for magnetic field manipulation and focusing.

BACKGROUND OF THE INVENTION

Previous approaches to sub-wavelength focusing of electromagnetic radiation have generally been in relation to optical and other high frequency applications, in particular in relation to improved imaging. Low frequency electromagnetic regions, such as kHz electromagnetic radiation, have been of relatively little interest.

SUMMARY OF THE INVENTION

Examples of the present invention include apparatus and methods related to low-frequency magnetic field manipulation. Examples include design approaches and configurations of focusing devices, including generally planar structures, useful for low frequency electromagnetic field manipulations. A focusing device (which may be a planar structure or a curved structure) may also be referred to as a near-field plate (NFP) when the desired magnetic field profile is formed within the near field of the focusing device.

An example apparatus may be a generally planar device configured for near-field focusing of low frequency magnetic fields. The term near-field plate is not intended to be limiting in the examples below, as examples of the invention include various device configurations.

Applications include magnetic field modifications in low frequency electromagnetic devices such as motors and actuators. In this context, low frequency may refer to the kHz and MHz frequency ranges (and also to lower frequencies, such 1 Hz-30 MHz), and is in contrast to GHz and optical frequencies, which may be referred to as high frequency. As will be demonstrated, the design and configurations of such low frequency devices differ significantly from high frequency devices.

At high frequencies, electric and magnetic fields are coupled so one needs impedance elements to control them simultaneously. For example, near-field plates described by Grbic et al. include interdigitated capacitors. In the low frequency case, E and H are decoupled, allowing devices for either electric or magnetic field control to be made. Examples of the present invention include devices for magnetic field control (such as magnetic field focusing) including conductive loops. Conductive loops can be formed by forming an array of apertures in a conducting film, such as a metal layer supported by a dielectric substrate or embedded in a material such as, but not limited to, a high permeability material such as Mu-metal, Permalloy, electrical steel, ferrite, steel, nickel, cobalt, neodymium magnet materials, or other high permeability magnetic alloy or material.

Example apparatus may be configured to focus magnetic fields in the kHz/MHz frequency ranges, and lower frequencies. For example, an example device may focus or otherwise manipulate electromagnetic radiation in the frequency range 1 Hz-30 MHz, more particularly 100 Hz-1 MHz.

In some examples, a magnetic field is incident normal or near normal (for example, within 30° of normal, such as within 20°, and more preferably within 10° of normal) to the focusing device. The ratio $K(r)$ of the magnetic field to the curl of the induced current density at each unit cell is used as a design parameter for the apparatus, allowing calculation of an impedance distribution. In some examples of the present invention, the focusing device is a passive device having a real impedance $K(r)$ distribution (i.e. a resistance distribution). Such structures can be formed by patterned electrical conductors, and in some examples do not require the use of appreciable reactive components.

In contrast, for higher frequency optical and the microwave regimes, incident electromagnetic fields are typically parallel to the focusing device. Focusing devices have previously been designed using imaginary surface impedances, i.e. inductance and capacitance. For example, near-field plates for high frequency applications are described by Grbic et al. in U.S. Pat. Pub. No. 2009/0303154, which discloses a passive surface impedance distribution that is entirely imaginary. In Grbic et al., NFPs for high frequency operation focused electromagnetic fields below the diffraction limit in the THz to GHz range, e.g. for applications in optical telecommunication.

Example structures, according to examples of the present invention, include a plurality of conductive loops, such as provided by a patterned conductor having a plurality of apertures. The apertures may be arranged in one or two dimensional arrays, and represent non-conducting regions within a conductive loop. Examples include ladder structures having spaced-apart elongate apertures, such as metallic periodic ladder structures. A focusing device may include a pair of such metallic periodic-ladder structures, for example a pair of ladder-shaped conducting structures arranged end-to-end along a common axis and separated by a central gap therebetween. Examples include a device comprising a pair of metallic periodic-ladder structures placed proximate each other with a central gap between them, acting to focus a normal incident magnetic field to a small spot. A ladder structure may be designed using the ratio of the transmitted magnetic field to the curl of the induced current at each unit cell in the periodic structure.

Hence, a method of generating a desired magnetic field distribution, such as a focused or otherwise manipulated magnetic field, from an incident magnetic field comprises providing a structure having a first side and a second side, directing the incident magnetic field towards the first side of the structure, and obtaining the desired magnetic field distribution as a transmitted field at a predetermined distance from the second side. The desired magnetic field distribution results from the surface impedance $K(r)$ profile, the surface impedance $K(r)$ profile being a distribution of real impedance values. The incident magnetic field may have a frequency in the range 1 Hz-30 MHz, more particularly in the range 10 Hz-600 kHz. The incident magnetic field may be incident normally on the first side of the planar structure.

An example apparatus includes a patterned electrical conductor having an array of apertures. For example, a patterned electrically conducting layer, such as a metal layer, may be formed on a dielectric substrate or a film. Preferably the substrate has a low dielectric loss at operating frequencies. A patterned electrical conductor may include one or more ladder-like structures, for example having a one or two dimensional array of apertures. The spatial distribution of real impedance values, such as the configuration of patterned conductor, may be determined by a ratio of a transmitted magnetic field at the second side of the planar structure to a curl of the induced current density within the structure.

BRIEF DESCRIPTION OF THE FIGURES

FIG. 1 shows an example design process for a focusing device.

FIG. 2 shows boundary conditions for the electric and magnetic field.

FIG. 3A shows an infinitesimal electric dipole, and FIG. 3B shows an infinitesimal magnetic dipole.

FIG. 4 shows the device plane at z–0 and the focal plane placed at $z=Z_0$, and the device is assumed to include a patterned impedance structure that can focus an EM wave to spots or lines.

FIG. 5 shows the spatial distribution of target sinc and hybrid-sinc functions for $R_e=10^6$ and $\lambda=600$ m.

FIG. 10A shows an analytical model of a focusing device composed of eleven unit cells. (dimension; $a_a=1.3$ mm), and FIG. 10B shows a focusing device implemented with two metallic periodic-ladder structures having a central gap.

FIG. 11 shows the designed distribution of the ratio $K(x)$ of the transmitted magnetic field to the curl of the induced current density.

DETAILED DESCRIPTION OF THE INVENTION

Figure 6:
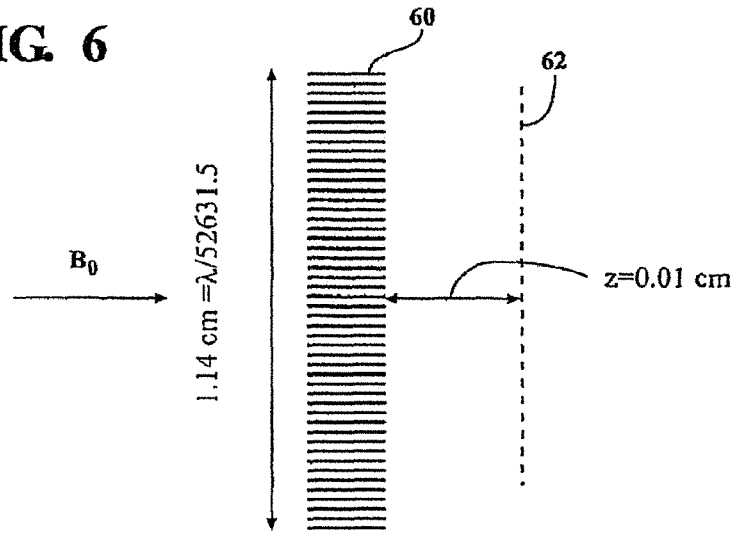
FIG. 6 shows the structure of a 19 element device operating in the kHz range.

Examples of the present invention include novel design approaches and configurations for focusing devices, such as near-field plates, used to modify magnetic field distributions for electromagnetic radiation having low frequencies, such as the kHz/MHz ranges. Novel design processes for devices configured to manipulate magnetic fields at kHz frequencies were developed.

Example applications include focusing the magnetic field in electromechanical systems such as motors and actuators. For example, a device according to an example of the present invention may be located adjacent or otherwise proximate a pole of an electromagnet, such as the pole of an actuator electromagnet, on one or more poles of a magnetic motor, such as a stator or rotor pole. The device may be planar, or curved, for example to conform to a supporting pole structure.

A focusing device, such as a near-field plate (NFP), may be used to focus electromagnetic radiation to a spot or line of arbitrary small sub-wavelength dimension. We performed an analytical simulation result of a kHz range device. A significant difference between device operation in the kHz range, in comparison with the GHz range, is that the radial component of magnetic field is dominant in the case of kHz range, while the azimuthal component is dominant in the case of the GHz range. Consequently, it is necessary to apply perpendicular boundary condition in the kHz case, in contrast to parallel condition used in the case of the GHz range.

Examples of the present invention include apparatus and methods for magnetic field control. An example focusing device includes a plurality of electrically conductive loops, which may be arranged in an array (1D, 2D, or 3D). Conductive loops can be formed by an array of apertures in an electrically conducting film, or by ring-like structures or other conducting paths surrounding a non-conductive region. Conductive loops can be formed using a patterned electrical conductor, such as a patterned metal layer supported by a non-electrically-conducting (e.g. dielectric) substrate. Also, conductive loops can be formed using a patterned electrical conductor embedded in (or otherwise supported by) a high permeability material. Example high permeability materials include Mu-metal, Permalloy, electrical steel, ferrite, steel, nickel, cobalt, neodymium magnet materials, and other high permeability magnetic alloys or materials. A high permeability material may have a relative permeability of >10000, such as >50,000. Conductive loops may be elongated (e.g as a conducting path around an elongated slot formed in a conducting film), or other shape as required.

In an example approach, Method of Moments (MoM) and Green's function approaches are used to calculate the spatial magnetic field distribution across the device and focal plane. Our formulation from Maxwell's equation leads to dominant real part of impedance design (compared to imaginary part in GHz range). In these calculations, the definition of impedance is found to be $B_1/(\nabla \times J)$, where $B_1$ is the total magnetic field after the device, and J is the induced current density in the impedance element. The theoretical approaches described herein are valid close to the device.

FIGS. 1A-1D show an example design process. FIG. 1A shows the near-field plane (device plane) 10 and the focal plane 12 defined, where the device is located at the device plane and the magnetic field is focused at the focal plane.

FIG. 1B shows the desired magnetic field distribution 14 defined by $H_f(y)$.

FIG. 1C shows a segmented near-field device (such as an NFP) configured to establish the magnetic current density necessary to produce the desired field distribution. The device includes a plurality of elements 16. Then, the magnetic current density M(y) on the device (e.g. an NFP) needed to establish desired focal pattern is found. The total magnetic field $H_T(y, z=0)$ is calculated at the device due to the magnetic current and the excitation. Surface impedance can be calculated using the ratio K(r) of magnetic current density and total magnetic field. Finally, a near-plate configuration giving a desired impedance profile is determined.

FIG. 1D shows the actual/obtained field distribution 18 obtained upon addition of the device. A similar approach can be used for focusing devices where the magnetic field is focused outside the near field region.

As described further below, analytical and numerical simulations showed that a pair of metallic periodic-ladder structures placed with a central gap focused a normal incident magnetic field on a spot of 2.6 mm ($0.52 \times 10^{-5}$ free space wavelength), full width at half maximum at a 1 mm distance away at 600 kHz.

Calculation of Field Distribution from Maxwell's Equation

Considering a homogeneous medium with permeability and permittivity $\in$ and $\mu$, electric and magnetic fields must satisfy the frequency-domain Maxwell's equations $$\nabla \times E = -M - j\omega\mu H$$

$$\nabla \times H = J + j\omega \in E$$

$$\nabla \cdot D = q_e$$

$$\nabla \cdot B = q_m \quad (1a\text{-}1d)$$

Here $D = \in E$, $B = \mu H$, and the time dependence $e^{j\omega t}$ has been assumed. Though the magnetic current M and charge $q_m$ are not physically realizable quantities, here they are realized as mathematical tools to solve the problem in hand. Here, J is the electric current density and $q_e$ is the electric charge. At the interface between regions of different dielectric properties, the generalized electromagnetic boundary conditions are written as:

$$-\hat{n} \times (E_2 - E_1) = M_s$$

$$\hat{n} \times (H_2 - H_1) = J_s$$

$$\hat{n} \cdot (D_2 - D_1) = q_e$$

$$\hat{n} \cdot (B_2 - B_1) = q_m \quad (2a\text{-}d)$$

where n is the normal vector on the interface, pointing from region 1 to region 2.

FIG. 2 shows the interface between region 1 and region 2, Here, $H_1$, $H_2$, $E_1$ and $E_2$ follow the perpendicular boundary conditions, while $D_1$, $D_2$, $B_1$, and $B_2$ follow parallel boundary conditions as described by Equation 2a-d above. Electric and magnetic field distribution E, H in a spherical coordinate system can be expressed as $E(r, \theta, \phi)$ and $H(r, \theta, \phi)$, respectively.

FIGS. 3A and 3B show an infinitesimal electric dipole and an infinitesimal magnetic dipole, respectively. The field distribution of electric and magnetic fields of an infinitesimal electric and magnetic dipole can be expressed in equation 3a-3c and 4a-4c, respectively.

$$E_{jr} = \eta \frac{Il}{2\pi} k^2 \left( \frac{1}{(kr)^2} - j\frac{1}{(kr)^3} \right) \cos(\theta) e^{-jkr} \quad (3a)$$

$$E_{j\theta} = \eta \frac{Il}{4\pi} k^2 \left( j\frac{1}{kr} + \frac{1}{(kr)^2} - j\frac{1}{(kr)^3} \right) \sin(\theta) e^{-jkr} \quad (3b)$$

$$H_{j\varphi} = \frac{Il}{4\pi} k^2 \left( j\frac{1}{kr} + \frac{1}{(kr)^2} \right) \sin(\theta) e^{-jkr} \quad (3c)$$

$$H_{mr} = \frac{Il}{2\pi} k^2 \left( \frac{1}{(kr)^2} - j\frac{1}{(kr)^3} \right) \cos(\theta) e^{-jkr} \quad (4a)$$

$$H_{m\theta} = \frac{Il}{4\pi} k^2 \left( j\frac{1}{kr} + \frac{1}{(kr)^2} - j\frac{1}{(kr)^3} \right) \sin(\theta) e^{-jkr} \quad (4b)$$

$$E_{m\varphi} = -\eta \frac{Il}{4\pi} k^2 \left( j\frac{1}{kr} + \frac{1}{(kr)^2} \right) \sin(\theta) e^{-jkr} \quad (4c)$$

Here, k is the wave vector of the electromagnetic wave.

Now, we consider the case of a magnetic dipole in order to understand the frequency dependent behavior of the magnetic field distribution.

In the high frequency regime, such as THz or GHz frequency ranges, Equ. 4a4b leads to $H_{mr} \sim (Ilk^2/2\pi)(j/(kr)^3)e^{-jkr}$ and $H_{m\theta} \sim 0$, which leads to domination of the normal component of the field. Since the normal component is dominant in the high frequency regime, the perpendicular boundary condition needs to be applied as described by Equ. 2a-2b.

In contrast, in the low frequency range, due to the $1/(kr)^3$ term, $H_{mr} \sim 0$ and $H_{m\theta} \sim (Ilk^2/2\pi)(j/(kr))e^{-jkr}$. This leads to application of parallel boundary conditions, as given by Equ. 4b and 4c. The term "low frequency" may be used to describe frequencies at which these approximations are applicable. The term "kHz frequency" is sometimes used in various examples for conciseness, but it examples of the present invention include any frequency for which the low frequency approximations described herein are applicable, and in some examples may further include lower frequencies than 1 kHz.

Starting from Maxwell's equations and taking the curl of Equ. 1a and 1b, one obtains:

$$\nabla^2 H + k^2 H = -\nabla \times J + j\omega\varepsilon M + \nabla\left(\frac{q_m}{\mu}\right) \quad (5)$$

Since Maxwell's equations are linear, we can consider J and M to be superposition of point sources distributed over arbitrary volume space. So, if we know the response of a point source, we can solve the original problem by integrating the response over the volume. We can use this idea to convert Equ, 4 into an integral equation. We now introduce Green's function G(r,r'), which satisfies the scalar Helmholtz equation:

$$\nabla^2 G(r,r') + k^2 G(r,r') = -\delta(r,r') \quad (6)$$

Assuming G(r,r') is known, assuming $q_m = 0$, we can get H via:

$$H(r) = -\iiint G(r,r')[-\{\nabla \times J(r')\} + j\omega \in M(r')] dr' \quad (7)$$

To use this equation, we now find the solution equation (6) and obtain G(r,r'). Assuming two dimensional Green's functions, it can be proved that:

$$G(\rho, \rho') = -\frac{j}{4} H_0^{(2)} |k(\rho - \rho')| \quad (8)$$

Here, $H_0^{(2)}$ is the $0^{th}$ order Hankel function of the second kind. Therefore, Equ. 7 turns out to be:

$$H(\rho) = \frac{j}{4} \int [-\{\nabla \times J(\rho')\} + j\omega\varepsilon M(\rho')] H_0^{(2)} |k(\rho - \rho')| d\rho' \quad (9)$$

In high frequency region, the induced magnetic current M dominates which leads to the final field distribution, which in the case of GHz frequency turns out to be:

$$H(\rho) = -\frac{\omega\varepsilon}{4} \int M(\rho') H_0^{(2)} |k(\rho - \rho')| d\rho' \quad (10)$$

In contrast, for the low frequency range considered in examples of the present invention, an induced electric current will dominate the generation of the magnetic field, which leads to a kHz version of the field equation as:

$$H(\rho) = -\frac{j}{4}\int [\nabla \times J(\rho')]H_0^{(2)}|k(\rho-\rho')|d\rho' \qquad (11)$$

Example Device Design for Low-Frequency (e.g. Khz) Operation

FIG. 4 shows an example geometry for a low-frequency device. The focusing device 40 is located at z=0 and the focal plane 42 is located at z=$Z_0$. The device is placed along the y-x plane, spanning from y=−L/2 to L/2. A surface impedance structure 40 is shown by two-dimensional boxes along the center of the y-x planes. Here, $B_0$ is the incoming magnetic field, which induces an electric current in the device. This phenomenon will lead to alteration of desired magnetic field distribution $B_1$ very close to the device.

Applying the normal boundary condition, Equ. 2d, we get:

$$B_1 = B_0 - \frac{j\mu}{4}\int_{-L/2}^{L/2}[\nabla \times J(y')]_x H_0^{(2)}|k(y-y')|dy \qquad (12)$$

We consider 2n+1 impedance elements $K_n$ in a device, labeled as −n to n with symmetric impedance structure $K_n=K_{-n}$. The point matching method can be employed to convert this integral equation following 2n+1 linear equations.

$$M_0 B_1(y = n \cdot l_c) = \qquad (13)$$
$$B_0(y = n \cdot l_c) - \frac{j\mu}{4}\sum_{m=-n}^{n} S_x(y = n \cdot l_c)\int_{m\cdot l_c - \frac{l_c}{2}}^{m\cdot l_c + \frac{l_c}{2}} H_0^2(k|n \cdot l_c - y'|)dy'$$

Here $l_c$=L/(2n+1). The definition of impedance has been adopted from following Fredholm integral equation of second kind. Here, $M_0$ is the magnification factor.

$$B_0 - \frac{j\mu}{4}\int_{-L/2}^{L/2}S_x H_0^{(2)}|k(y-y')|dy' = Z(y)S_x(y) \qquad (14)$$

Or, $$K(y) = \frac{B_0 - \frac{j\mu}{4}\int_{-L/2}^{L/2}S_x H_0^{(2)}|k(y-y')|dy'}{S_x(y)} \qquad (15)$$

Two types of desired distribution $B_1(y)$ were considered, the sine function and the sine-hybrid function. These are given by, respectively:

$$B_1(y) = \frac{\sin(qy)}{qy} \qquad (16)$$

$$B_1(y) = \frac{L[L\cos(qy) + y\sin(qy)]}{[L^2 + y^2]} \qquad (17)$$

Here, q=$k_0 R_e$, where, $k_0$ is free space wave vector. $R_e$ is called the resolution enhancement factor.

To obtain the unknown $S_x$, method of moment has been used to solve equation (13). Then total field at the device surface can be computed as, $$B_{total}(y) = B_0 - \frac{j\mu}{4}\int_{-L/2}^{L/2}S_x H_0^2|k(y-y')|dy' \qquad (18)$$

The impedance $K_n(y)$ distribution to achieve the desired magnetic field can be calculated by dividing $B_{total}(y)$ by $S_x$. In order to ensure a passive impedance structure, only the real part of K(y) has been taken, and $S_x$ has been recalculated for the passive impedance structure using Equ. 14. We adopted the following definition of the passive impedance structure, $$Z_{Passive}(y) = C \cdot Re(Z) \qquad (19)$$

Here, C=$e^{j\delta}$ is an adjustable constant with δ nearly equal to 1. After finding the current density is found for the passive device, the scattered field can be calculated using 2D Green's function, $$B_{Space}(y,z) = B_0 - \frac{j\mu}{4}\int_{-L/2}^{L/2}S_x H_0^2\left(k\left|\sqrt{(y-y')^2 + z^2}\right|\right)dy' \qquad (20)$$

FIG. 5 shows the spatial distribution of target sinc (50) and hybrid-sinc (52) functions for $R_c=10^6$ and λ=600 m. The curves overlap considerably.

FIG. 6 shows the structure of a 19 element device (60) operating in the kHz range, with the focal plane shown as a dashed line (62). To obtain a continuous variation in surface impedance, the current rotation function $S_x$ on the device was divided into 19 discrete elements, where n varies from −9 to +9, and the numerical solution of Equ. 13 was obtained. We assumed both sine and hybrid-sinc functions as the desired spatial distribution. The segments are designed to be symmetric across the origin and located at (n.$l_c$,0). Here, for a device working at 500 kHz range $l_c$=0.06 cm and L=λ/52631.5 or 1.14 cm.

In these calculations we assumed incident plane wave magnetic field is of the form B=$B_0$ $e^{-jl\pi/2}$ with l=0 and $B_0$=1 T. In these calculations, we used magnification factor $M_0$=1.

Figure 7A:
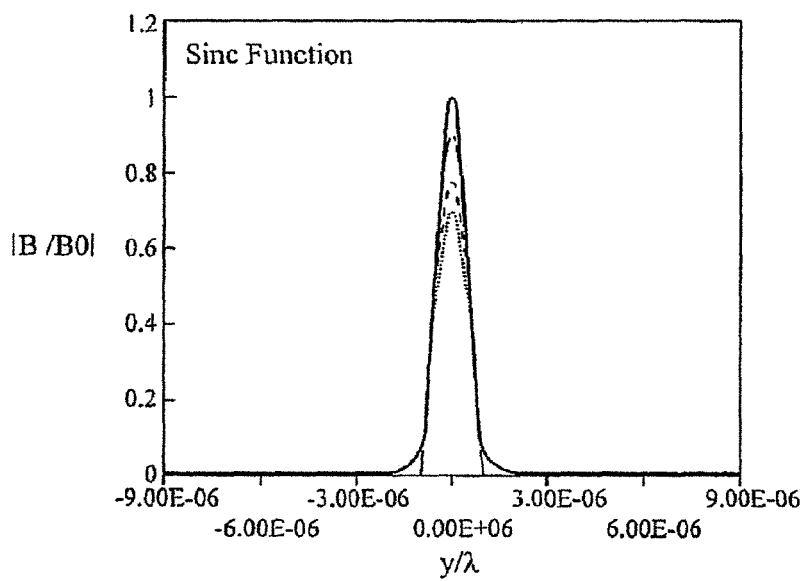
FIG. 7A shows the calculated magnetic field distribution at the device and the focal plane.

FIG. 7A shows the full-wave simulation result of the magnetic field profile at the device and the focal plane located at Z=0.01 cm. The solid lines show the field distribution with active impedance component and the theoretical focus. The upper two curves (solid and dashed lines) corresponds to the field distribution at the focusing device, and the lower two curves (solid and dashed lines) correspond to the field distribution the focal plane. The magnetic field peak falls sharply as the focal plane moves away from the origin. Therefore, in order to obtain larger effects of field manipulation in kHz, the focal plane has to be located very close to the device. The dashed lines represent the focus that would produce by a passive impedance structure. A phase factor δ=0.992 was introduced to the passive impedance structure. For example, in examples of the present invention the magnitude of the phase factor may be between 0.9 and 1.

Figure 7B:
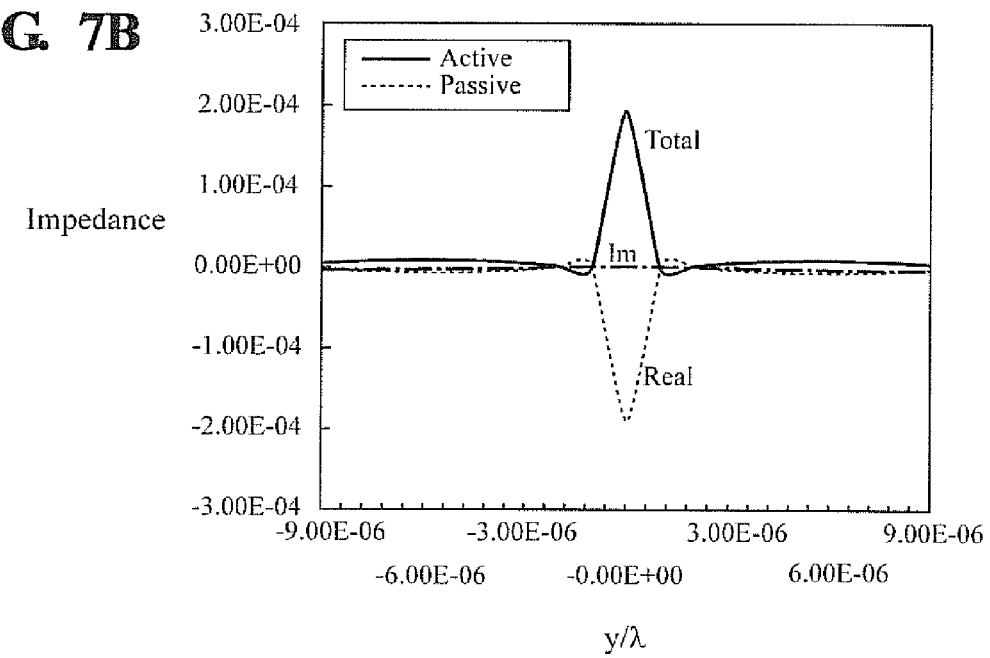
FIG. 7B shows impedance distribution across the device, where the dashed line (Real) shows the real component, the dashed line (Im) shows the imaginary component, and the solid line is the total impedance, clearly showing that the real part of the impedance dominates the impedance.

FIG. 7B shows the distribution of real and imaginary part of the impedance across the device. The upper solid line is the total impedance, the lower dashed line is the real component, and the other dashed line is the imaginary component.

Figure 8A:
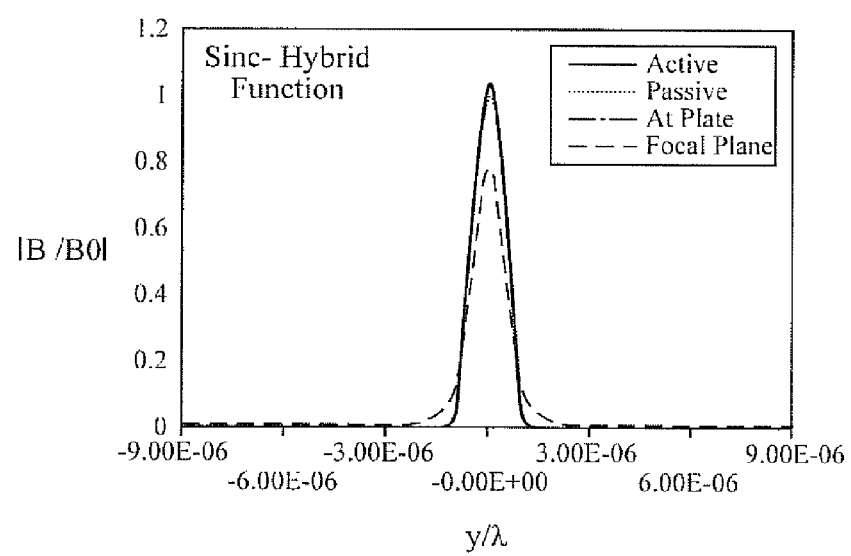
FIG. 8A shows the calculated magnetic field distribution at the device and the focal plane in the case of sine-hybrid function.
Figure 8B:
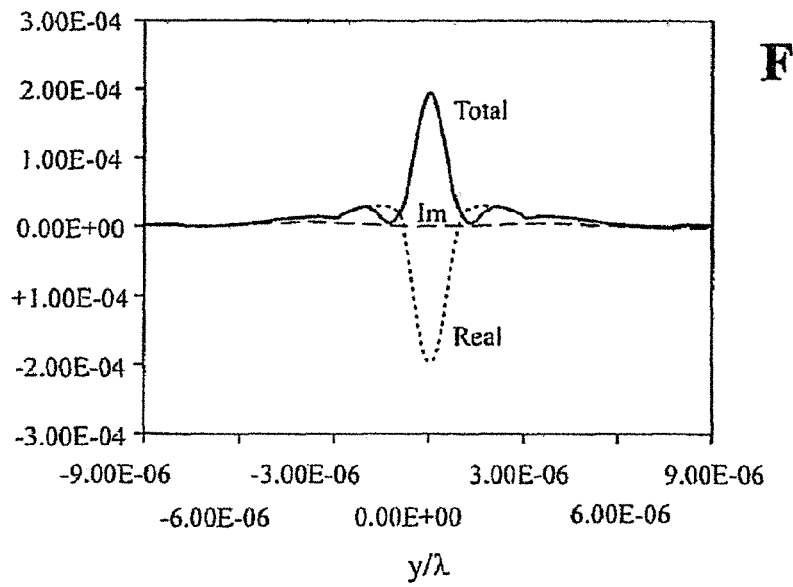
FIG. 8B shows the impedance distribution, where the dashed line (labeled Real) is the real component, the dashed line (Im) is the imaginary component, and the solid line is the total impedance, showing that the real part of the impedance dominates.

FIGS. 8A and 8B show similar results as for FIGS. 7A and 7B, using a sinc-hybrid function. The curves in FIG. 8A are analogous to those described above in relation to FIG. 7A, and the curves of FIG. 8B are analogous to those described above in relation to FIG. 7B.

Effect of Number of Elements

Figure 9:
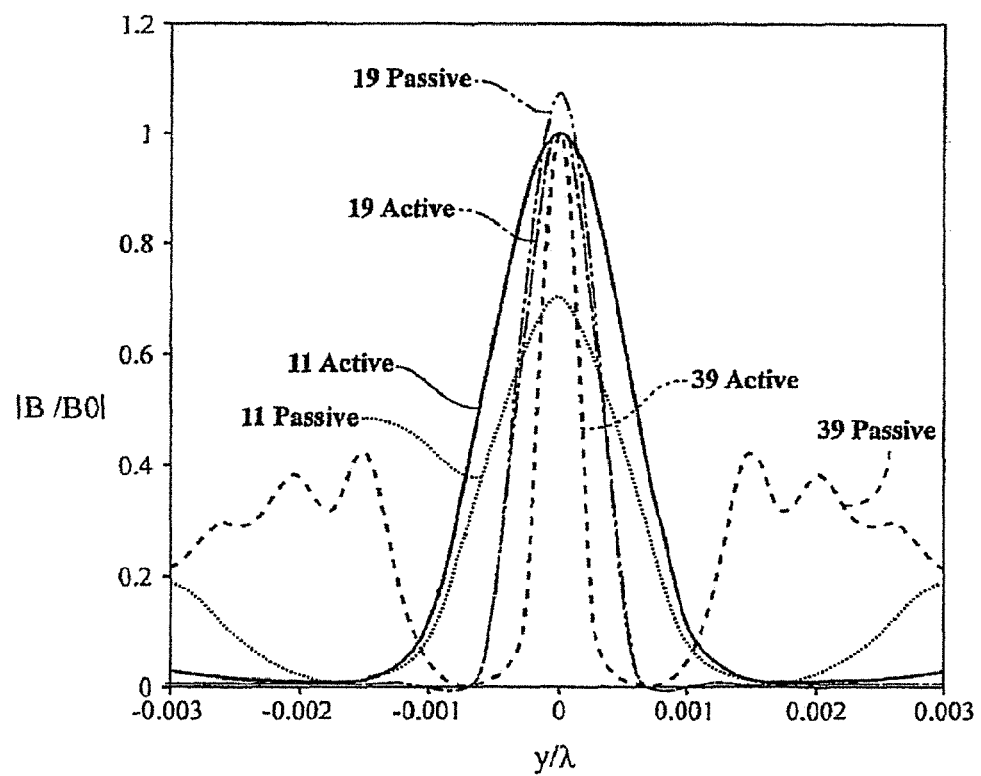
FIG. 9 shows the calculated magnetic field distribution at a device as a function of a varying number of impedance elements.

FIG. 9 shows magnetic field distribution for active and passive impedance elements with 11, 19 and 39 elements. The solid lines represent active impedance, with the 11 element curve being broadest, and the 39 element curve being the narrowest. The dashed lines represent passive impedance elements. Surprisingly, there was an optimum element number when a passive design is used.

As shown in FIG. 9, with a higher number of elements (e.g. 39 elements), secondary side bands appears in the passive design structure, while at lower element number (e.g. 11 elements), the field distribution maxima cannot be achieved. However, the 19 element design appears to be optimum, with the highest peak maximum and no appreciable sidebands. Here, in all cases, $l_c$=0.06 cm and L=$\lambda$/52631.5 or 1.14 cm.

Hence, an optimized number of elements allows a field distribution maximum to be achieved, without introducing significant secondary side bands. Far example, a device may include a number of elements between 15 and 29.

Dual Ladder Structure Example

An example focusing device was designed using a pair of ladder structures.

FIG. 10A shows an analytical model of an example device, such as a near-field plate (100). The analytical model has eleven unit cells along the x axis at z=0, and the focal plane (102) is located at z=d. The incident and transmitted magnetic fields flow along the z direction. No magnetic field variation is assumed in they direction.

FIG. 10B shows an example device implemented with two metallic periodic-ladder structures (110 and 112) having a central gap (118). Each structure comprises elongated slot-like gaps (apertures 114) surrounded by conducting elements, including edge conductors (120) and bridge conductors (116). In this example, the structure has dimensions $a_d$=1.6 mm, $w_d$=0.6 mm, gap thickness $g_{dl}$=1 mm, central gap thickness $g_{dc}$=0.7 mm, overall length $L_d$=17.9 mm, width $H_d$=20 mm, conducting layer thickness $t_d$=0.15 mm, and a conductivity of 5.997×10$^7$ at 600 kHz.

The design procedure starts with the wave equation (21), having the curl of the induced current density at the right hand side that differs markedly from the counterpart theory for the optical and the microwave domains, as discussed further above:

$$(\nabla^2+k^2)\vec{H}=-\nabla\times\vec{J} \quad (21)$$

where $\vec{H}$ is the magnetic field, $\vec{J}$ is the induced current density, and k is the wave number. The magnetic field is given by:

$$\vec{H}(x,z)=\int G(x,z,x',z'=0)\nabla\times$$
$$\vec{J}(x')dx'=-j(\tfrac{1}{4})[H_0^{(2)}(k((x-x')^2+z^2)^{1/2})\nabla\times$$
$$\vec{J}(x')dx' \quad (22)$$

where $H_0^{(2)}(k((x-x')^2+z^2)^{1/2})$ is the 0th order Hankel function of the second kind. The boundary condition at z=0 satisfies the following equation:

$$\vec{H}_{trans}(x)=\vec{H}_{in}(x)-j(1/4)\int_{-L/2}^{L/2}H_0^{(2)}(k|x-x'|)\nabla\times\vec{J}(x')dx' \quad (23)$$

where $\vec{H}_{in}(x)$ and $\vec{H}_{trans}(x)$ are magnetic fields in the regions z≤0 and z≥0, respectively.

Once the magnetic field distribution $\vec{H}_{trans}(x,z=L)$ is set at the focal plane, then the transmitted magnetic field $\vec{H}_{trans}(x,z=0)$ is calculated using a back-propagation method. Consequently, $\nabla\times\vec{J}(x')$ is obtained. The impedance K(x) in the Fredholm integral equation (24) of the second kind, can be calculated by the Method of Moments (MoMs).

$$\vec{H}_{in}(x)-j(1/4)\int_{-W/2}^{W/2}H_0^{(2)}(k|x-x'|)\nabla\times\vec{J}(x')dx'=K(x)\nabla\times\vec{J}(x') \quad (24)$$

i.e, K(x) is the ratio of the transmitted magnetic field to the curl of the induced current density, $\vec{H}_{trans}(x)/\nabla\times\vec{J}(x')$, at z=0. This ratio is a distinguishing parameter, compared and contrasted with the theory of the optical and the microwave domains.

Equ. 24 is converted to the matrix equation for applying the point matching method.

$$\vec{H}_{in,n}-j(1/4)\sum_{m=-N}^{N}H_0^{(2)}(ka_m|n-m|)\nabla\times\vec{J}_m a_m=\sum_{m=-N}^{N}K_{n,m}\nabla\times\vec{J}_m \quad (25)$$

where $a_m$ is the mth unit cell length.

Figure 12A:
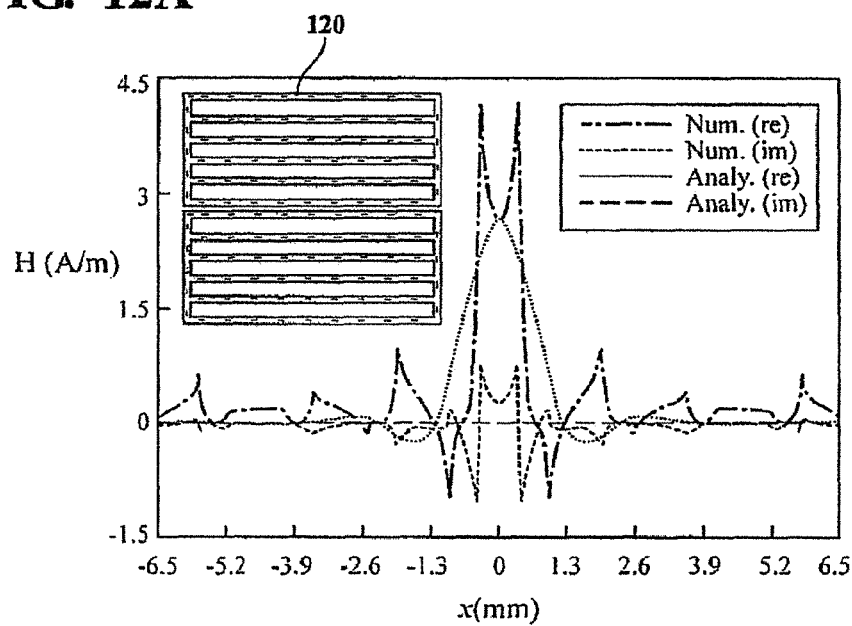
FIG. 12A shows real and imaginary parts of magnetic field distributions of the analytical model (FIG. 10A) and the double metallic periodic-ladder structure (FIG. 10B) at (a) z=0 and (b) z=1 mm, using the analytical model of FIG. 10A and COMSOL Multiphysics simulations of the structure of FIG. 10B, where the inset shows a snapshot of the current distribution on the double periodic-ladder structure.
Figure 12B:
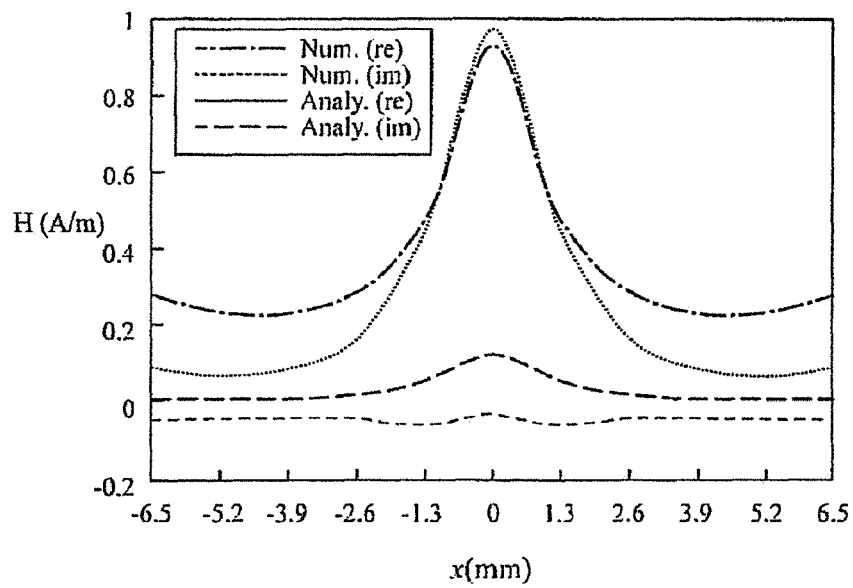

A desired magnetic field distribution is set at a sinc function of $Mq_0d \exp(-q_0d) \sin(q_0x)/(q_0x)$ at z=1 mm (shown in FIG. 12B as the curve labeled Analy(re)), where M=2.5 (scaling factor), $q_0$=1.0×10$^5$ (>>k). The magnetic field distribution at z=0 is calculated with the back-propagation as ~Md(d $\cos(q_0x)$+x $\sin(q_0x)$)/($d^2+x^2$), shown in FIG. 12B.

FIG. 11 shows the designed distribution of the ratio K(x) of the transmitted magnetic field to the curl of the induced current density. The distribution of K(x) was calculated by the MoMs and is presented with the multiplication of $k^2$ to obtain the dimensionless parameter displayed in FIG. 11. The real part has the two peaks at ±2.6 mm and also a peak around the center. Since the magnetic field distribution only has a peak at x=0 as shown in FIG. 12A, the two peaks at ±2.6 mm implies a small $\nabla\times\vec{J}(x')$.

In the optical and microwave domains, the imaginary part has a flat characteristic over the whole range, and the corresponding parameter is the surface impedance which needs to be imaginary in the design for passive devices. In contrast, for the kilohertz band, the K(x) distribution is selected to have real values in the design for passive devices.

The double metallic periodic-ladder structure of FIG. 10B satisfies desired the K(x) distribution. The central unit cell, having the strong magnetic field, is implemented by the central gap between the two periodic-ladder structures. Each unit cell, except for the central one, corresponds to a metallic rounded conductive loop of the ladders. Metallic strips along the y direction inside the ladders are shared by unit cells next to each other and the currents induced on the strips inside the ladders are weakened based on the principle of the superposition, resulting in small currents.

FIGS. 12A and 12B show the magnetic field intensity distributions at z=0 and 1 mm, respectively. The double periodic-ladder structure of FIG. 10B was simulated by the Finite Element Method (FEM) based simulator, COMSOL Multiphysics (COMSOL, Inc., Burlington, Mass.). The analytical model shown in FIG. 10A, and the double metallic periodic-ladder structure of FIG. 10B, gave rise to a spot of 2.6 mm full width at half maximum (FWHM) as shown in FIG. 12B.

The inset of FIG. 12A (120) shows strong currents on the circumference of each ladder structure due to the cancellation of currents on the shared wires. Also, it shows small currents near the center of each ladder structure as was predicted from the small values of the curl of the currents near the center.

Magnetic fields can be focused on a spot of $0.52 \times 10^{-5} \lambda_0$ FWHM, where $\lambda_0$ is free space wavelength. With regard to the magnetic fields at z=0 (FIG. 12A), the focusing device (FIG. 10B) has a central peak (thick alternating dashed line) as the case of the analytical model (thin dotted line), and has discontinuous variations in the distribution due to the currents on the metallic ladder structures.

Hence, both analytical and numerical simulations showed that the pair of metallic periodic-ladder structures, located with a central gap between them, focused a normal incident 600 kHz magnetic field at a spot of 2.6 mm ($0.52 \times 10^{-5}$ free space wavelength), full width at half maximum at a 1 mm distance away from the plane of the structures.

In some examples, the apparatus may be a generally planar structure, for example including a patterned electrical conductor supported by a planar dielectric substrate. In other examples, the impedance profile may be formed on a curved surface. A focusing device being a curved sheet-like structure, for example including a patterned electrical conductor supported by a flexible or curved sheet-like dielectric substrate. For example, a pattern of conducting elements (such as a patterned conducting film) may be formed on a flexible substrate that is conformed to a curved surface. The patterned electrical conductor may include one or more conducting sheets having apertures formed therethrough, in some examples including an array of apertures. The focusing device need not include reactive components, such as capacitors or inductors.

Low frequency magnetic field focusing was theoretically demonstrated, and a focus spot of 2.6 mm FWHM was demonstrated using numerical simulations of double periodic-ladder structure. Apparatus may be configured for various kilohertz magnetic field manipulations, such as magnetic field focusing and other field manipulations, such as focusing to a line focus. A desired magnetic field may be focused at one or more focus spots or lines, as determined by the configuration of the apparatus.

Example applications include focusing the magnetic field in electromechanical systems, for example at the pole of an electromagnet. Examples include modifying the magnetic field profile within a magnetic device such as an actuator, magnetic motor (such as a switched reluctance motor (SRM), as often used for air-conditioners, washing machines, and other applications), spectrometer (such as a magnetic resonance spectrometer or imaging device), metal detector, relay, loudspeaker, magnetic levitation device, relay, transformer, inverter, transducer, and the like. For example, devices may be used to focus magnetic fields for increasing the magnetic force on a moveable component (such as the plunger of an actuator, or rotor of an inductance motor).

Example apparatus according to the present invention include (but are not limited to) improved actuators, motors, invertors, switched reluctance motors (SRM) used for air-conditioners or washing machines, and other magnetic and/or electromagnetic devices including a structure as described herein. Example apparatus include power transmission systems, such as systems operating at 13.56 MHz or other frequencies.

In some examples, an apparatus may be generally planar, the impedance profile of the focusing device being a generally two-dimensional profile. In some examples, there may be an impedance profile in the third dimension, for any desired purpose.

An example apparatus, which may have a generally planar form, can be fabricated as a conducting pattern on a dielectric substrate. For example, metal films may be patterned using conventional lithographic methods, such as photolithography. Example apparatus may be fabricated using printed circuit board techniques, as wires supported by a frame, or as a self-supporting patterned conductor. Example apparatus may include a plurality of parallel substrates, some or all of which support a patterned conducting film.

A method of designing a focusing device, such as a near field plate, for obtaining a desired magnetic field distribution from an incident magnetic field comprises determining a ratio parameter profile required to obtain the magnetic field distribution, the ratio parameter profile being a spatial distribution of a ratio of transmitted magnetic field to a curl of the induced current density, determining a surface impedance profile from the ratio parameter profile, the surface impedance profile being a spatial distribution of real impedance values, and configuring the focusing device to have the surface impedance profile. The desired magnetic field is obtained when the incident magnetic field is incident on the focusing device, in particular where the incident magnetic field has a frequency in the range 1 Hz-30 MHz. The magnetic field distribution may be formed at a predetermined distance from the focusing device, on the opposite side of the focusing device from the incident radiation. The transmitted magnetic field may be determined from the desired magnetic field using a back-propagation method from the desired magnetic field. A desired magnetic field profile may be a focused magnetic field or any desired modification of the incident magnetic field. The surface impedance profile may be provided by a patterned electrical conductor supported by a dielectric substrate.

The invention is not restricted to the illustrative examples described above. Examples described are not intended to limit the scope of the invention. Changes therein, other combinations of elements, and other applications will occur to those skilled in the art.

Having described our invention, we claim:

1. A method of modifying an incident magnetic field to obtain a magnetic field distribution and improving a magnetic and/or electromagnetic device such as an actuator, motor, invertor, switched reluctance motors and the like, the method comprising:
providing a focusing device having a first side and a second side;
directing the incident magnetic field towards the first side, the incident magnetic field generating an induced electrical current profile within the focusing device; and
obtaining a transmitted magnetic field from the second side, the transmitted magnetic field providing the magnetic field distribution,
the transmitted magnetic field being generated by the induced electrical current profile within the focusing device,
the incident magnetic field having a frequency in the range 1 Hz-30 MHz.

2. The method of claim 1, wherein the focusing device includes a patterned electrical conductor, the spatial distribution of the induced electrical current profile being determined by the patterned electrical conductor.

3. The method of claim 2, wherein the patterned electrical conductor has an array of apertures formed therethrough.

4. The method of claim 1, wherein the patterned electrical conductor includes a pair of ladder-shaped conducting structures arranged end-to-end along a common long axis and separated by a gap therebetween.

5. The method of claim 1, wherein the incident magnetic field is incident normally or near-normally on the first side.

6. The method of claim 1, wherein a magnetic field profile is a focused incident magnetic field obtained within a near field region of the focusing device.

7. The method of claim 1, wherein the focusing device is a generally planar structure or a curved sheet-like structure.

8. An apparatus, the apparatus being a focusing device configured to obtain a magnetic field distribution from an incident magnetic field and improve a magnetic and/or electromagnetic device, said apparatus comprising:
the focusing device having a first side and a second side, and including a plurality of conductive loops, a transmitted magnetic field emerging from the second side when the incident magnetic field is incident on the first side,
the incident magnetic field inducing an electric current profile within the focusing device, the electric current profile inducing the transmitted magnetic field and having an induced current density,
the magnetic field distribution being obtained using the transmitted magnetic field,
the focusing device having a spatial profile of real values of a ratio of the transmitted magnetic field to a curl of the induced current density,
the focusing device being configured for an incident magnetic field frequency in a range 1 Hz-30 MHz.

9. The apparatus of claim 8, wherein the focusing device includes:
a dielectric substrate; and
a patterned electrical conductor supported by the dielectric substrate, the patterned electrical conductor providing the plurality of conductive loops.

10. The apparatus of claim 8, wherein the patterned electrical conductor includes a conducting film having an array of apertures formed therethrough.

11. The apparatus of claim 8, wherein the patterned electrical conductor includes a ladder-shaped conducting element.

12. The apparatus of claim 11, wherein the patterned electrical conductor includes a pair of ladder-shaped conducting elements arranged end-to-end and separated by a gap region.

13. The apparatus of claim 8, wherein the magnetic field distribution is a focused magnetic field.

14. The apparatus of claim 8, wherein the focusing device has a planar form a planar dielectric substrate supporting a conducting sheet,
the conducting sheet having an array of apertures formed therethrough.

15. The apparatus of claim 8, wherein the focusing device has a curved sheet-like form.

16. A magnetic apparatus including the focusing device of claim 8, wherein the magnetic apparatus is a motor, an actuator, or a power inverter.

17. The magnetic apparatus of claim 16, wherein the magnetic apparatus includes a pole piece, the focusing device being supported by the pole piece.

18. The apparatus of claim 16, wherein the magnetic apparatus is a switched reluctance motor.

19. An apparatus, the apparatus being a focusing device configured to obtain a magnetic field distribution from an incident magnetic field and improve a magnetic and/or electromagnetic device, said apparatus comprising:
the focusing device including a substrate supporting a patterned electrical conductor, the patterned electrical conductor providing a plurality of conductive loops,
the focusing device having a first side and a second side, a transmitted magnetic field emerging from the second side when the incident magnetic field is incident on the first side,
the incident magnetic field inducing an electric current profile within the patterned electrical conductor, the electric current profile inducing the transmitted magnetic field,
the magnetic field distribution being obtained using the transmitted magnetic field,
the focusing device being operable for an incident magnetic field frequency in a range 1 kHz-30 MHz.

20. The apparatus of claim 19, wherein the patterned electrical conductor includes a conducting sheet having an array of apertures formed therethrough.

21. The apparatus of claim 20, wherein the patterned electrical conductor includes a ladder-shaped conducting element having a linear array of slot-like apertures.

* * * * *